(12) United States Patent
Kuo

(10) Patent No.: US 8,693,266 B2
(45) Date of Patent: Apr. 8, 2014

(54) APPARATUS AND METHOD FOR TRIMMING REFERENCE CELL IN SEMICONDUCTOR MEMORY DEVICE

(75) Inventor: Chung-Shan Kuo, Shulin (TW)

(73) Assignee: Seoul National University Industry Foundation, Seoul (KR)

( * ) Notice: Subject to any disclaimer, the term of this patent is extended or adjusted under 35 U.S.C. 154(b) by 306 days.

(21) Appl. No.: 13/276,779

(22) Filed: Oct. 19, 2011

(65) Prior Publication Data

US 2013/0100734 A1   Apr. 25, 2013

(51) Int. Cl.
*G11C 7/14* (2006.01)

(52) U.S. Cl.
USPC ............... 365/189.09; 365/189.07; 365/185.2

(58) Field of Classification Search
CPC ........ G11C 16/10; G11C 16/28; G11C 16/06; G11C 7/14
USPC .............................. 365/189.07, 189.09, 185.2
See application file for complete search history.

(56) References Cited

U.S. PATENT DOCUMENTS

| | | | |
|---|---|---|---|
| 6,205,056 B1 * | 3/2001 | Pan et al. | 365/185.2 |
| 6,873,143 B2 * | 3/2005 | Moon et al. | 323/312 |
| 7,440,330 B2 * | 10/2008 | Noichi | 365/185.2 |
| 2008/0137433 A1 * | 6/2008 | Kim et al. | 365/185.22 |
| 2008/0192537 A1 * | 8/2008 | Kasuta | 365/185.2 |
| 2011/0050196 A1 * | 3/2011 | Fuse et al. | 323/312 |

* cited by examiner

*Primary Examiner* — Douglas King
(74) *Attorney, Agent, or Firm* — Morris, Manning & Martin, LLP; Juan Carlos A. Marquez

(57) ABSTRACT

A method of trimming a reference cell in a semiconductor memory device comprises the steps of: generating a reference current based on a bias voltage applied to the reference cell; generating a first current and a second current based on the value of a control voltage and the resistance of a precision resistor disposed outside the semiconductor memory device; comparing the reference current with the first current; comparing the reference current with the second current; programming the reference cell if the value of the reference current is greater than that of the first current; and erasing the reference cell if the value of the reference current is less than that of the second current. The value of the second current is less than that of the first current.

18 Claims, 10 Drawing Sheets

| CONDITION | CODE |
|---|---|
| condition I ($V_R > V_3$) | code1 |
| condition II ($V_3 > V_R > V_1$) | code2 |
| condition III ($V_R < V_2$) | code3 |
| condition IV ($V_2 < V_R < V_4$) | code4 |

| reference cell state | erase | read | program |
|---|---|---|---|
| threshold voltage | 3V | 3.75V | 6V |

| | state to be confirmed | erase | read | program |
|---|---|---|---|---|
| METHOD I | $V_B$ | 5V | 5V | 7V |
| | $V_C$ | 1.7V | 1.1V | 0.9V |
| | $I_F$ | 170μA | 110μA | 90μA |
| METHOD II | $V_B$ | 3V | 3.75V | 6V |
| | $V_C$ | 0.8V | 0.8V | 0.8V |
| | $I_F$ | 8μA | 8μA | 8μA |
| METHOD III | $V_B$ | 4.25V | 5V | 7.25V |
| | $V_C$ | 1.1V | 1.1V | 1.1V |
| | $I_F$ | 110μA | 110μA | 110μA |

APPARATUS AND METHOD FOR TRIMMING REFERENCE CELL IN SEMICONDUCTOR MEMORY DEVICE

BACKGROUND OF THE INVENTION

1. Field of the Invention

The present invention relates to a method of trimming a reference cell in a semiconductor memory device, a semiconductor memory device, and a parallel trimming apparatus.

2. Description of the Related Art

Semiconductor memory devices are devices in which data can be stored and from which stored data can be retrieved. Semiconductor memory devices can be classified into volatile memory and nonvolatile memory. The nonvolatile memory devices comprise electrically erasable and programmable ROM cells, known as flash EEPROM cells. FIG. 1 shows a vertical cross-section of a flash EEPROM cell 10. Referring to FIG. 1, an N-type source region 13 and an N-type drain region 14 are formed on a P-type substrate or a bulk region 12. A p-type channel region is formed between the source region 13 and the drain region 14. A floating gate 16, which is insulated by an insulating layer 15, is formed on the P-type channel region. A control gate 18, which is insulated by another insulating layer 17, is formed on the floating gate 16.

FIG. 2 shows threshold voltages of the flash EEPROM cell 10 during program and erase operations. Referring to FIG. 2, the flash EEPROM cell 10 has a higher threshold voltage range (about 6 to 7V) during the program operation, and has a lower threshold voltage range (about 1 to 3V) during the erase operation.

Referring to FIG. 1, in order to program the EEPROM cell 10, a high positive voltage (e.g. 10V) is applied to the control gate 18 of the cell 10. In addition, a moderate positive voltage (e.g. 4.5V) is applied to the drain region 14, and the source voltage and the substrate voltage are at ground level. During the program operation, hot electrons need to be injected from the channel region adjacent to the drain region 14 to the floating gate electrode, so that the threshold voltage of the EEPROM cell increases.

In order to erase the EEPROM cell 10, a negative voltage (e.g. −10V) is applied to the control gate 18 of the cell 10. In addition, the source region 13 of the cell 10 is set to 5.5 V and the drain region 14 of the cell 10 is allowed to float. During the erase operation, the hot electrons injected into the floating gate 16 during the program operation need to be removed, so that the threshold voltage of the EEPROM cell decreases.

To verify whether an EEPROM cell has been erased or programmed, a reference cell is used to verify the state of the EEPROM cell. For example, a current of the EEPROM cell is compared to a current of the reference cell, and the result of the comparison is used to identify whether the memory cell is a program cell or an erase cell. Thus, generating an accurate current of the reference cell is important in determining the state of the EEPROM cell.

The reference cells are pre-programmed or trimmed by the manufacture of the memory to produce a specific reference current in response to a known gate voltage. FIG. 3 is a block diagram of a conventional semiconductor memory device 30 for performing the reference cell trimming. Referring to FIG. 3, the semiconductor memory device 30 comprises a reference cell 302, an I/O pad 304, a comparator 306 and a voltage supply controller 308. During the trimming process of the reference cell 302, the reference cell 302 is programmed in response to a bias voltage $V_B$ supplied by the voltage supply controller 308.

A reference cell current Iref flows between a drain region and a source region of the reference cell 302 in response to the bias voltage $V_B$. The comparator 306 compares an external bias current $I_x$ input from a tester (not shown) via the I/O pad 304 with the reference cell current Iref and outputs a comparison signal CS. The voltage supply controller 308 receives the comparison signal CS and supplies the bias voltage $V_B$ to the reference cell 302 based on the comparison signal CS. When the reference cell current Iref is within the given error range of the external bias current $I_x$, the reference cell trimming terminates.

In the conventional reference trimming in a semiconductor memory device, a tester must provide a constant current via the I/O pad. If there are eight reference cells to be trimmed, eight separate constant currents require to be supported to the eight semiconductor memory device on a test board. Such trimming apparatus requires complex hardware and software to use. Moreover, it is difficult to precisely measure the current to be with the desired range during the production process, and thus it requires a large amount of trimming test time for the reference cells in the semiconductor memory devices and increases labor costs. In order to solve the foregoing problems, there is a need to provide an improved trimming method and trimming apparatus.

SUMMARY OF THE INVENTION

One aspect of the present invention is to provide a method of trimming a reference cell in a semiconductor memory device.

According to one embodiment of the present invention, the method comprises the steps of: generating a reference current based on a bias voltage applied to the reference cell; generating a first current and a second current based on the value of a control voltage and the resistance of a precision resistor disposed outside the semiconductor memory device; comparing the reference current with the first current; comparing the reference current with the second current; programming the reference cell if the value of the reference current is greater than that of the first current; and erasing the reference cell if the value of the reference current is less than that of the second current. The value of the first current is greater than the value of the second current.

Another aspect of the present invention is to provide a semiconductor memory device.

According to one embodiment of the present invention, the semiconductor memory device comprises first and second voltage-to-current circuits, first, second, and third resistors, first and second comparators, and a trimming circuit. The first voltage-to-current circuit comprises a reference cell and is configured to convert a bias voltage to a reference current. The first resistor is connected to the first voltage-to-current circuit for generating a reference voltage based on the reference current. The second voltage-to-current circuit is configured to convert a control voltage to a first current and a second current whose value is less than the value of the first current. The second resistor is connected to the second voltage-to-current circuit for generating a first voltage based on the first current. The third resistor is connected to the second voltage-to-current circuit for generating a second voltage based on the second current. The first comparator is configured to compare the reference voltage with the first voltage, and output a first comparison signal. The second comparator is configured to compare the reference voltage with the second voltage, and output a second comparison signal. The trimming circuit is configured to trim the reference cell based on the first and second comparison signals. The resistance of the second resistor is substantially equal to that of the third resistor. The precision resistor is disposed outside the semiconductor memory device, and the second voltage-to-current circuit generates the first current and the second current based on the value of the control voltage and the resistance of the precision resistor.

Yet another aspect of the present invention is to provide a parallel trimming apparatus.

According to one embodiment of the present invention, the parallel trimming apparatus comprises a test board, a first bus, a second bus, a third bus, a plurality of precision resistors, and a plurality of semiconductor memory devices. The plurality of semiconductor memory devices are mounted on the test board and are connected to the first bus and the second bus in a parallel manner. The plurality of semiconductor memory devices are simultaneously enabled based on an enable signal sent from the third bus. Each semiconductor memory device is connected to a corresponding one of the precision resistors, and each semiconductor memory device comprises first and second voltage-to-current circuits, first, second, and third resistors, first and second comparators, and a trimming circuit. The first voltage-to-current circuit which comprises a reference cell is configured to convert a bias voltage to a reference current. The first resistor is connected to the first voltage-to-current circuit for generating a reference voltage based on the reference current. The second voltage-to-current circuit is configured to convert a control voltage to a first current and a second current based on the value of the control voltage and the resistance of the corresponding precision resistor. The second resistor is connected to the second voltage-to-current circuit for generating a first voltage based on the first current. The third resistor is connected to the second voltage-to-current circuit for generating a second voltage based on the second current. The first comparator is configured to compare the reference voltage with the first voltage, and output a first comparison signal. The second comparator is configured to compare the reference voltage with the second voltage, and output a second comparison signal. The trimming circuit is configured to trim the reference cell based on the first and second comparison signals. In particular, the resistance of the second resistor is substantially equal to that of the third resistor. The value of the second current is less than the value of the first current. The bias voltage is sent via the first bus and the control voltage is sent via the second bus.

BRIEF DESCRIPTION OF THE DRAWINGS

The invention will be described according to the appended drawings in which:

FIG. 10 is a table illustrating different methods to verify the state of the reference cell according to one embodiment of the present invention.

DETAILED DESCRIPTION OF THE INVENTION

Figure 1:
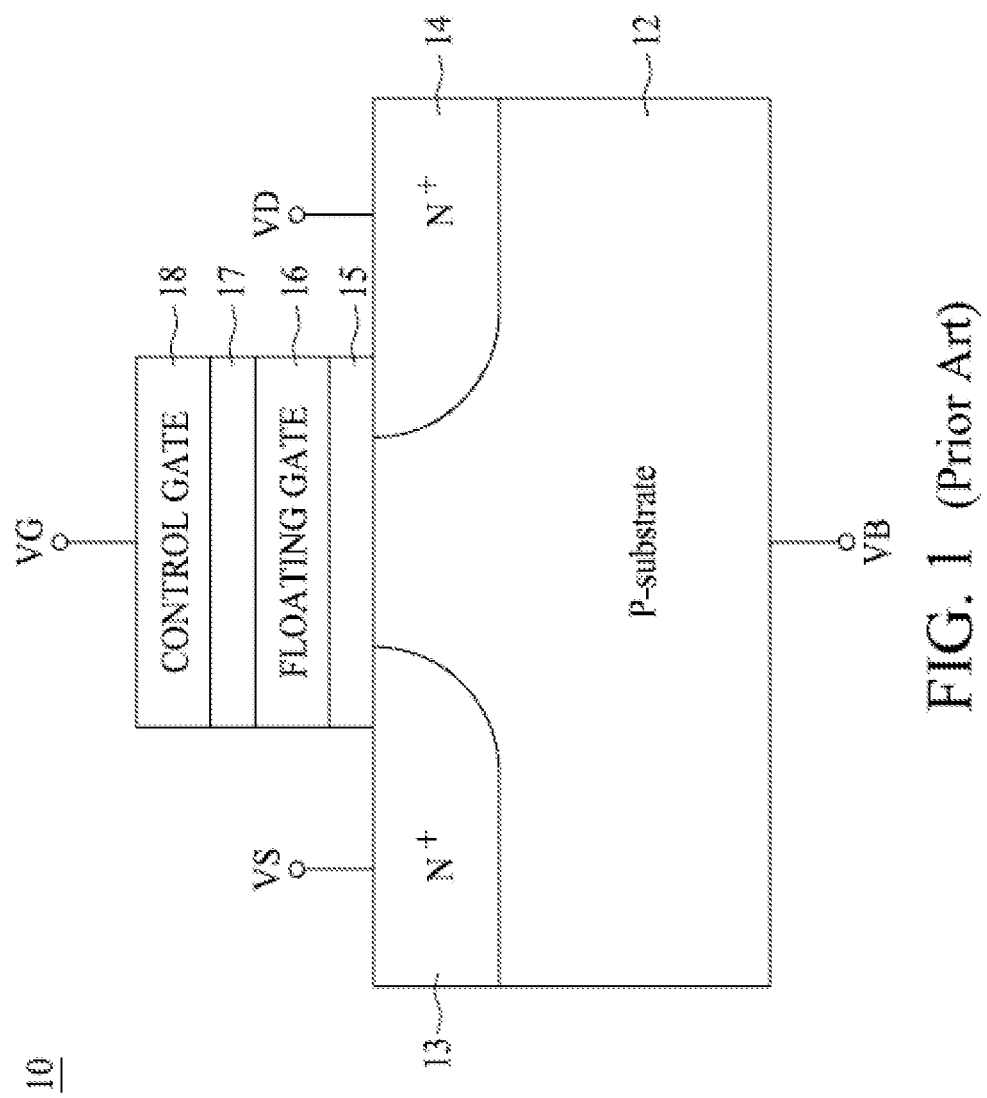
FIG. 1 shows a vertical cross-section of a flash EEPROM cell.
Figure 2:
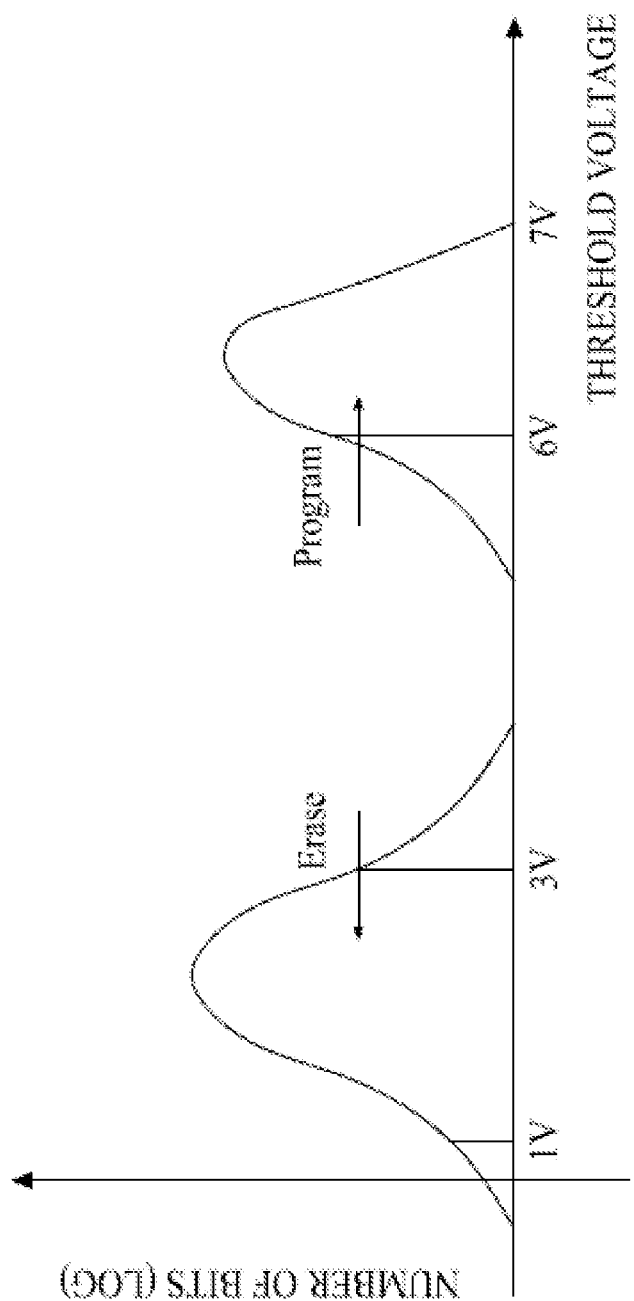
FIG. 2 shows threshold voltages of the flash EEPROM cell during program and erase operations.
Figure 3:
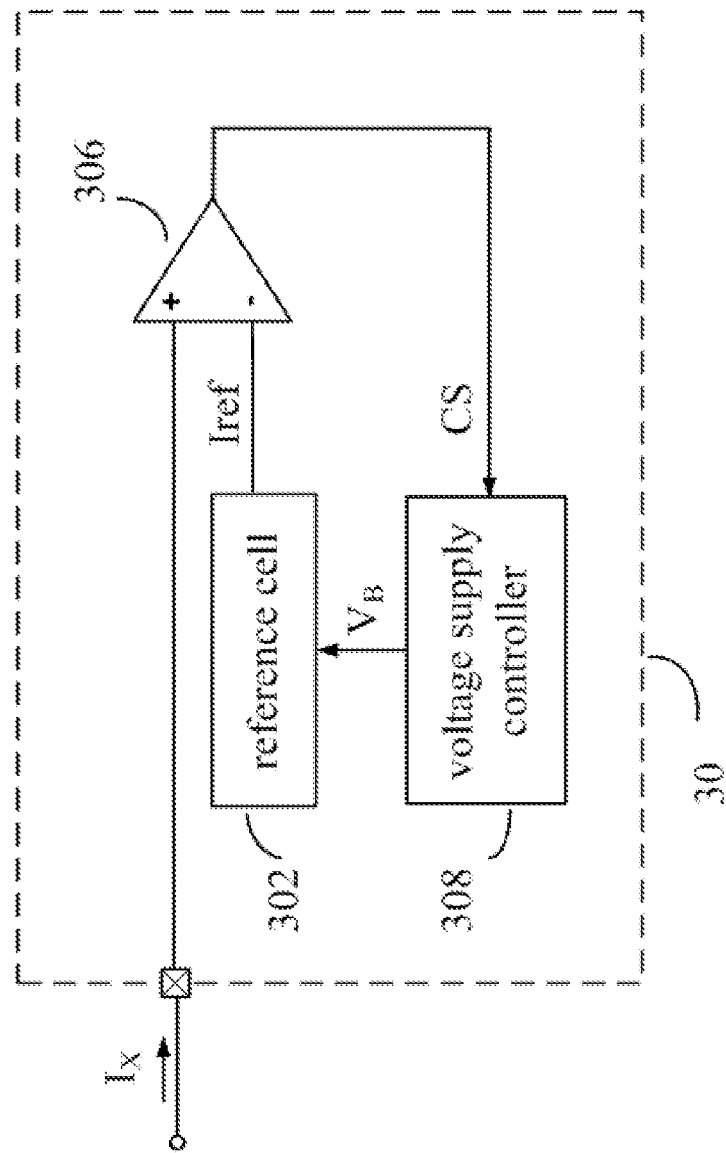
FIG. 3 is a block diagram of a conventional semiconductor memory device for performing the reference cell trimming.
Figure 4A:
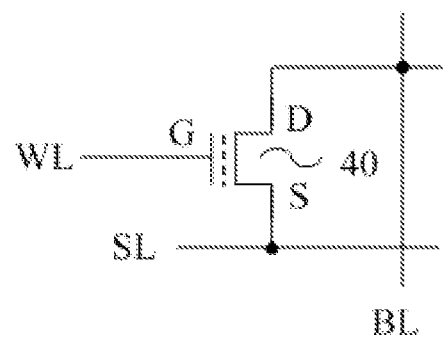
FIG. 4A shows a symbolic representation of a Flash-type reference cell.
Figure 4B:
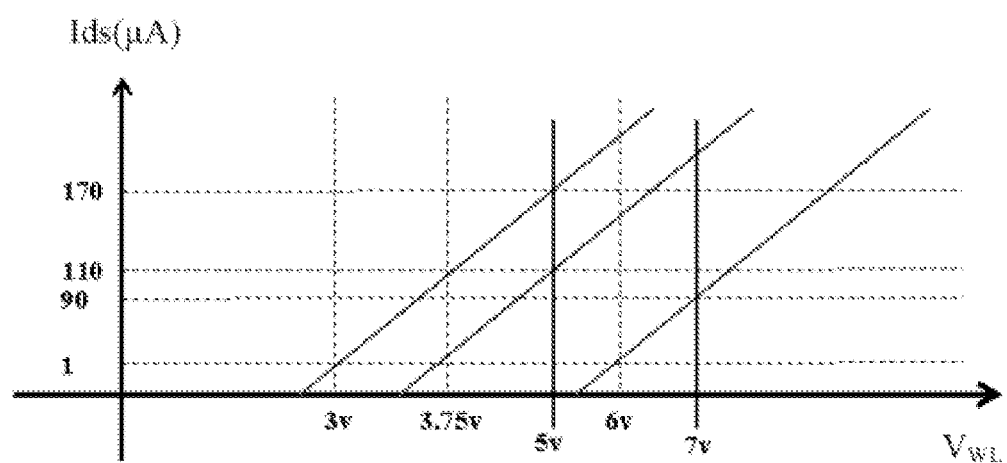
FIG. 4B shows the current-voltage curves of the flash reference cell.

FIG. 4A shows a symbolic representation of a Flash-type reference cell $M_R$. Referring to FIG. 4A, the reference cell $M_R$ is arranged in a memory array (not represented) including a plurality of memory cells arranged in lines and columns, such that the drain D of the reference cell $M_R$ is connected to a bit line BL, its source S is connected to a source line SL, and its control gate G is connected to a word line WL. FIG. 4B shows the current-voltage (I-V) curves "42", "44", and "46" of the flash reference cell $M_R$. These various curves "42", "44", and "46" show the operation of the flash reference cell $M_R$ in a saturated regime and define the drain-source current Ids (vertical axis) flowing through the flash reference cell $M_R$ according to the different word line voltage $V_{WL}$ (horizontal axis) applied to its control gate G. The drain-source current Ids is hereinafter referred to as a "reference cell current".

The curve "42" is the I-V curve of the flash reference cell MR having a threshold voltage $V_{TH1}$ at an erased state. In this embodiment, the desired threshold voltage $V_{TH1}$ is set to be 3V. Referring to FIG. 4B, if a verified voltage $V_{EV}$ of about 5V is applied to the control gate of the read reference cell $M_R$, a reference cell current of about 170 μA will flow through the cell. The curve "44" is the I-V curve of the flash reference cell $M_R$ having a threshold voltage $V_{TH2}$ at a read state. In this embodiment, the desired threshold voltage $V_{TH2}$ is set to be 3.75V. Referring to FIG. 4B, if a verified voltage $V_{READ}$ of about 5V is applied to the control gate of the read reference cell $M_R$, a reference cell current of about 110 μA will flow through the cell. The curve "46" is the I-V curve of the flash reference cell $M_R$ having a threshold voltage $V_{TH3}$ at a programmed state. In this embodiment, the desired threshold voltage $V_{TH3}$ is set to be 6V. Referring to FIG. 4B, if a verified voltage $V_{PV}$ of about 7V is applied to the control gate of the read reference cell $M_R$, a reference cell current of about 90 μA will flow through the cell.

Therefore, in order to verify whether the threshold voltage of the reference cell $M_R$ is trimmed to its desired value, the verify voltage $V_{EV}$ can be applied to the word line WL. If the reference cell $M_R$ is at the erased state, the measured reference cell current is within the target range, such as 170 μA±5 μA in this embodiment. In order to verify whether the threshold voltage of the reference cell $M_R$ is trimmed to its desired value, the verify voltage $V_{PV}$ can be applied to the word line WL. If the reference cell $M_R$ is at the programmed state, the measured reference cell current is within the target range, such as 90 μA±5 μA in this embodiment.

Figure 5:
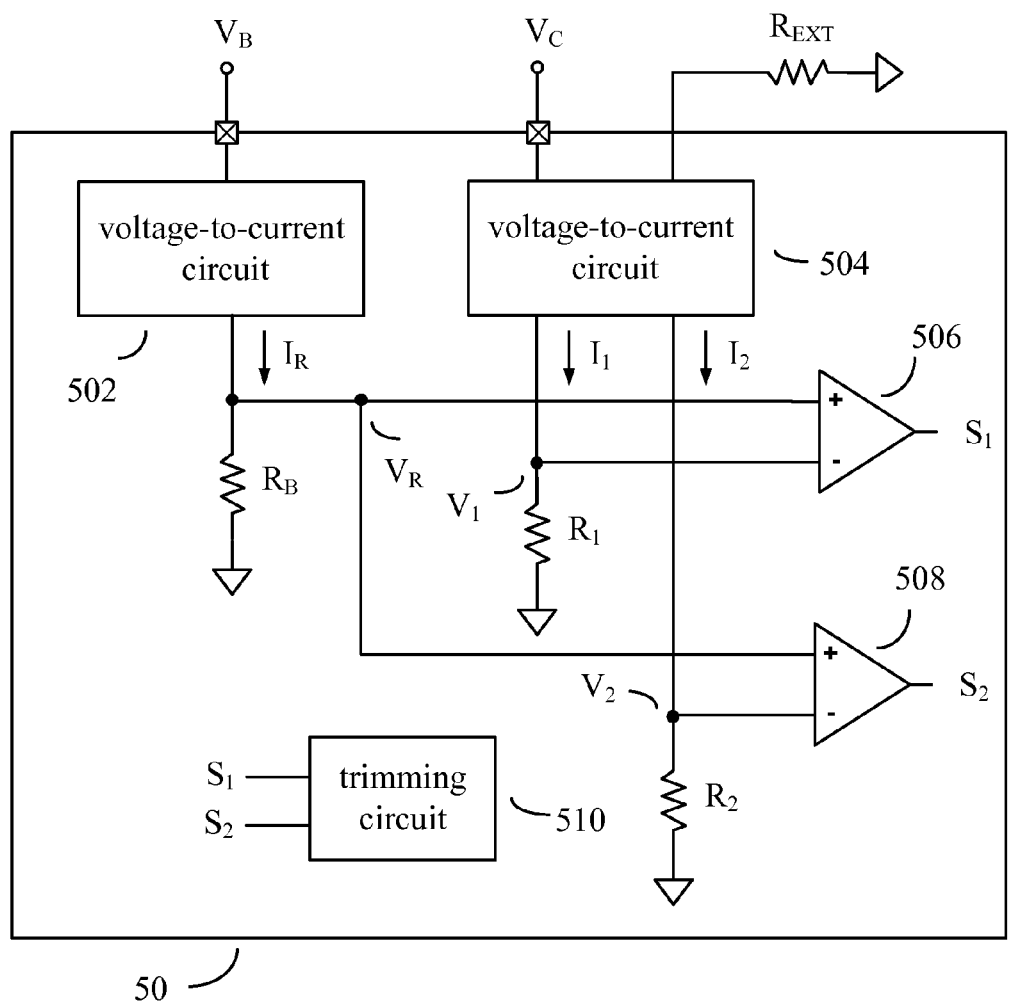
FIG. 5 shows a block diagram of a semiconductor memory device including the reference cell according to one embodiment of the present invention.

FIG. 5 shows a block diagram of a semiconductor memory device 50 including the reference cell $M_R$ according to one embodiment of the present invention. Referring to FIG. 5, the memory device 50 includes voltage-to-current circuits 502 and 504, resistors $R_1$, $R_2$, and $R_B$, comparators 506 and 508, and a trimming circuit 510. The voltage-to-current circuit 502 is configured to convert a bias voltage $V_B$ to a reference current $I_R$, and the resistor $R_B$ is connected to the voltage-tocurrent circuit 502 for generating a reference voltage $V_R$ based on the reference current $I_R$.

The voltage-to-current circuit 504 is configured to convert a control voltage $V_C$ to multiple currents $I_1$ and $I_2$, wherein the value of the current $I_1$ is greater than that of the current $I_2$. Referring to FIG. 5, a precision resistor $R_{EXT}$ is disposed outside the semiconductor memory device 50, and the voltage-to-current circuit 504 generates the currents $I_1$ and $I_2$ based on the control voltage $V_C$ and the resistance of the precision resistor $R_{EXT}$. The resistor $R_1$ is connected to the voltage-to-current circuit 504 for generating a voltage $V_1$ based on the current $I_1$, and the resistor $R_2$ is connected to the voltage-to-current circuit 504 for generating a voltage $V_2$ based on the current $I_2$. The comparator 506 is configured to compare the voltage $V_R$ with the voltage $V_1$, and output a comparison signal $S_1$, and the comparator 408 is configured to compare the voltage $V_R$ with the voltage $V_2$, and output a comparison signal $S_2$. The trimming circuit 510 is configured to trim the reference cell $M_R$ based on the comparison signals $S_1$ and $S_2$.

Figure 6:
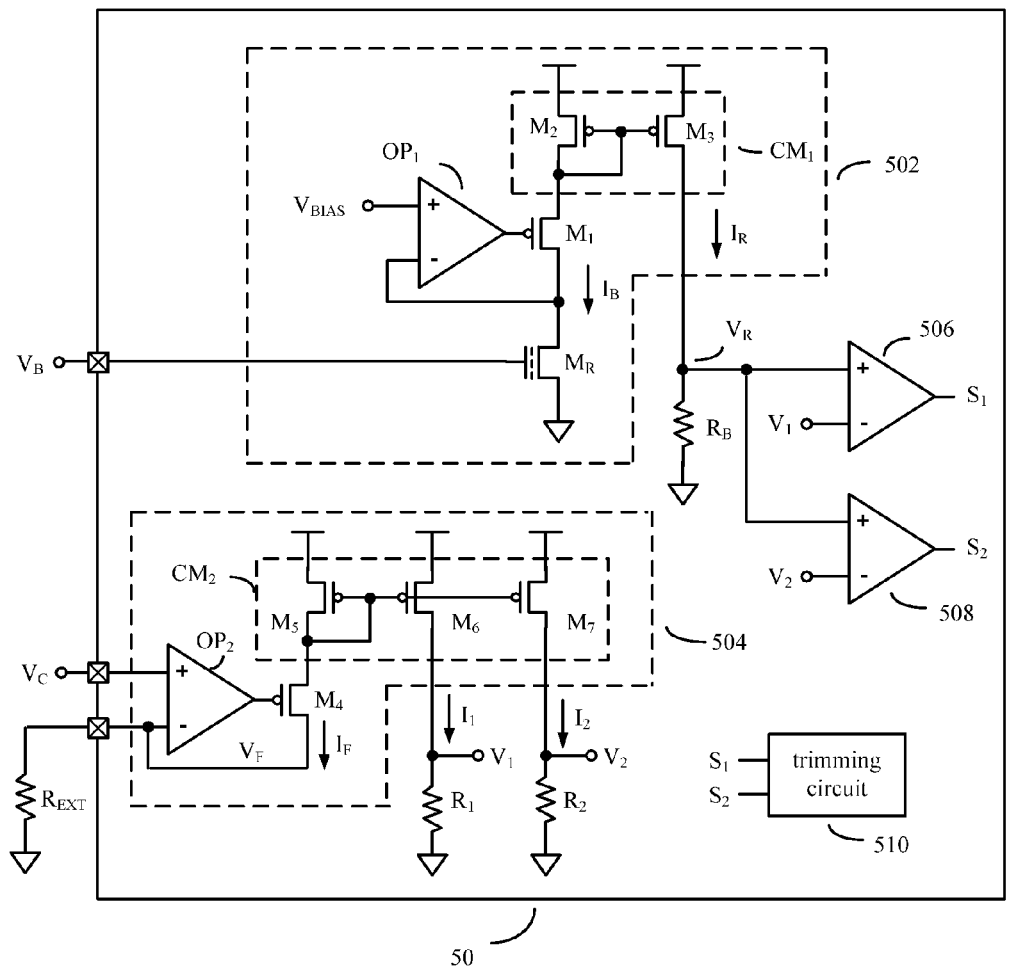
FIG. 6 is a more detailed block diagram of FIG. 5.

FIG. 6 is a more detailed block diagram of FIG. 5. Referring to FIG. 6, the voltage-to-current circuit 502 includes the reference cell $M_R$, an operational amplifier $OP_1$, a NMOS transistor $M_1$, and a current mirror circuit $CM_1$. A bias voltage $V_{BIAS}$ is applied to a non-inverting input terminal of the amplifier $OP_1$. An output terminal of the amplifier $OP_1$ is connected to a gate of the NMOS transistor $M_1$. A source of the NMOS transistor $M_1$ is connected to an inverting input terminal of the amplifier $OP_1$. A drain of the NMOS transistor $M_1$ is connected to the current mirror circuit $CM_1$. In this embodiment, PMOS transistors $M_2$ and $M_3$ constitute the current mirror circuit $CM_1$.

In operation, the bias voltage $V_B$ is applied to the gate of the reference cell $M_R$, and thus a current $I_B$ flowing through the reference cell $M_R$ is generated. The reference current $I_R$ is amplified in proportion to the ratio of current mirror sizes through the PMOS transistor $M_2$ and PMOS transistor $M_3$, and the voltage $V_R$ is generated by the product of the value of the amplified current $I_R$ and the resistance of the resistor $R_B$. The voltage $V_R$ is then sent to the non-inverting input terminals of the comparators 506 and 508.

Referring to FIG. 6, the voltage-to-current circuit 504 includes an operational amplifier $OP_2$, a NMOS transistor $M_4$, and a current mirror circuit $CM_2$. The control voltage $V_C$ is applied to a non-inverting input terminal of the amplifier $OP_2$. An output terminal of the amplifier $OP_2$ is connected to a gate of the NMOS transistor $M_4$. A source of the NMOS transistor $M_4$ is connected to an inverting input terminal of the amplifier $OP_2$. Therefore, since the control voltage $V_C$ is applied to the non-inverting input terminal and a feedback voltage $V_F$ is applied to the inverting input terminal of the amplifier $OP_2$, the gate voltage of the NMOS transistor $M_4$ is adjusted such that the feedback voltage $V_F$ is substantially equal to the control voltage $V_C$. A current $I_F$ generated by the control voltage $V_C$ and the external resistor $R_{EXT}$ flows through the current mirror circuit $CM_2$ and is amplified in proportion to the ratio of current mirror sizes through a PMOS transistor $M_5$, a PMOS transistor $M_6$, and a PMOS transistor $M_7$ in the current mirror circuit $CM_2$. Therefore, the voltage $V_1$ is generated by the product of the value of the amplified current $I_1$ and the resistance of the resistor $R_1$, and the voltage $V_2$ is generated by the product of the value of the amplified current $I_2$ and the resistance of the resistor $R_2$. The voltages $V_1$ and $V_2$ are then sent to the inverting input terminals of the comparators 506 and 508.

In this embodiment, the resistance of the resistor $R_1$ is substantially equal to that of the resistor $R_2$, and the value of the current $I_1$ is greater than that of the current $I_2$. The values of the currents $I_1$ and $I_2$ are determined based on the given error range of the reference cell current $I_B$. As mentioned above, if the reference cell $M_R$ is at an erased state, the reference cell current flowing through the reference cell $M_R$ will be within the target range (e.g. 170 μA±5 μA). Therefore, the voltage-to-current circuit 504 can be designed to generate the currents $I_1$ and $I_2$ of 175 μA and 165 μA, respectively. Referring to FIG. 6, the comparators 506 and 508 in this embodiment are voltage-type comparators. The comparator 506 compares the voltage $V_R$ with the voltage $V_1$ and the comparator 508 compares the voltage $V_R$ with the voltage $V_2$. If the value of the control voltage $V_C$ is set to 1.7V and the resistances of the external resistor $R_{EXT}$, resistor $R_1$, and resistor $R_2$ are set to 10KΩ, the values of the voltages $V_1$ and $V_2$ will be substantially equal to 1.75V and 1.65V, respectively. Therefore, if the if the reference cell $M_R$ is at the erased state and the resistance of the resistor $R_B$ is set to 10KΩ, the values of the voltages $V_R$ will be in a range between 1.65V and 1.75V. In this condition, comparator 506 will output a comparison signal $S_1$ at a logic low level and comparator 508 will output a comparison signal $S_2$ at a logic high level after receiving input signals $V_1$, $V_2$, and $V_R$, which disabling the trimming circuit 510.

However, if the values of the voltages $V_R$ is greater than that of the voltage $V_1$, the comparator 506 outputs the comparison signal $S_1$ at a logic high level. When receiving the comparison signal $S_1$ at the logic high level, the trimming circuit 510 repeats programming and verification steps on the reference cell $M_R$ until the values of the voltages $V_R$ is less than that of the voltage $V_1$. On the other hand, if the value of the voltages VR is less than that of the voltage $V_2$, the comparator 508 outputs the comparison signal $S_2$ at a logic low level. When receiving the comparison signal $S_2$ at the logic low level, the trimming circuit 510 repeats erasing and verification steps on the reference cell $M_R$ until the values of the voltages $V_R$ is greater than that of the voltage $V_2$.

Figure 7:
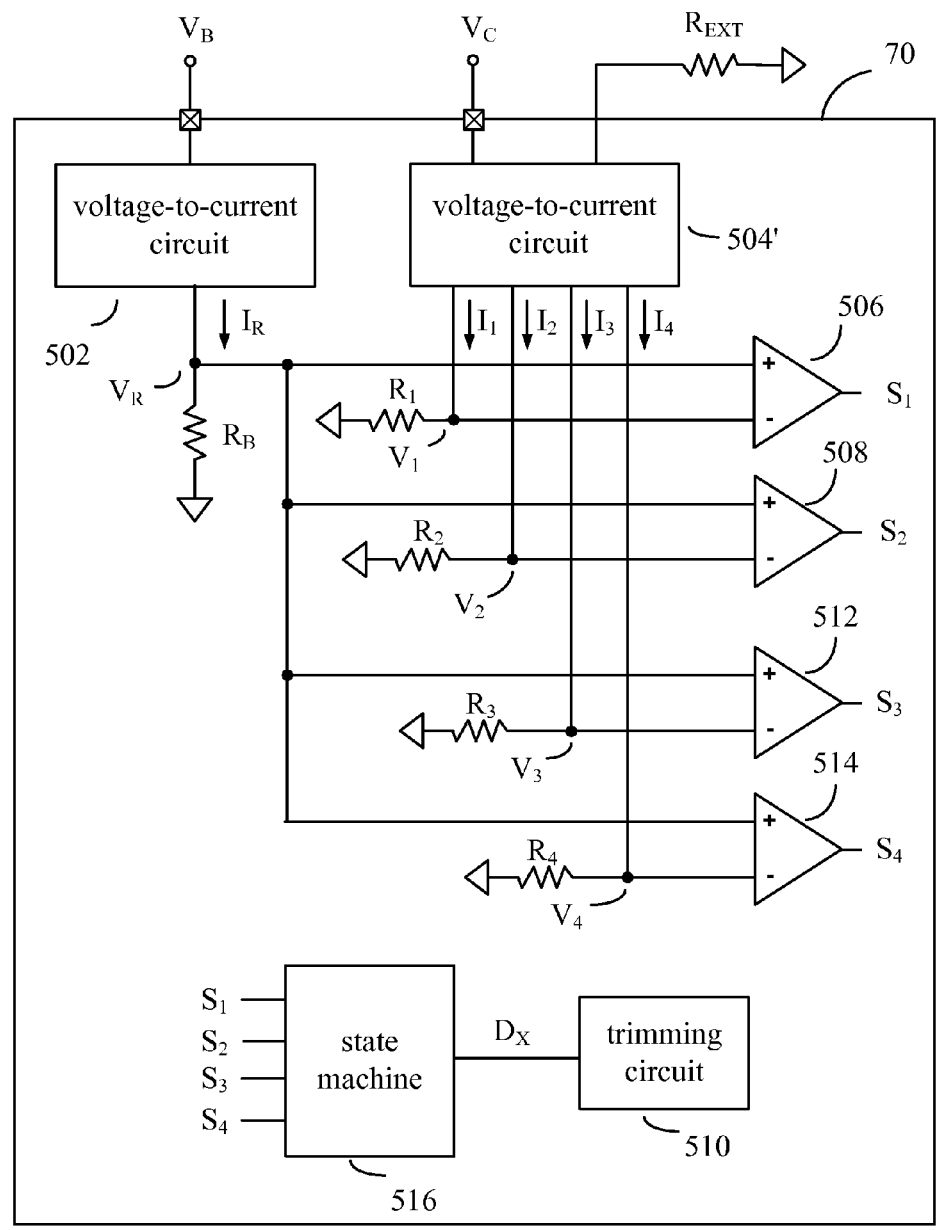
FIG. 7 shows a block diagram of a semiconductor memory device including the reference cell according to another embodiment of the present invention.

In order to reduce the trimming time for the reference cell $M_R$ in the semiconductor memory device 50, trimming strength can be adjusted based on the value of the reference cell current $I_B$. FIG. 7 shows a block diagram of a semiconductor memory device 70 including the reference cell $M_R$ according to another embodiment of the present invention. Circuits having similar functions to those in FIG. 5 are denoted by the same reference numerals and detailed descriptions thereof will be omitted. Referring to FIG. 7, the voltage-to-current circuit 504' converts the control voltage $V_C$ to a plurality of currents $I_1$, $I_2$, $I_3$, and $I_4$, wherein $I_3 > I_1 > I_2 > I_4$. In this embodiment, the voltage-to-current circuit 504 is designed to generate the currents $I_1$, $I_2$, $I_3$, and $I_4$ of 175 μA, 165 μA, 180 μA and 160 μA, respectively. A voltage $V_3$ is generated by the product of the value of the current $I_3$ and the resistance of a resistor $R_3$, and a voltage $V_4$ is generated by the product of the value of the current $I_4$ and the resistance of a resistor $R_4$. In this embodiment, the resistances of the resistor $R_3$ and $R_4$ are set to 10KΩ, and thus the values of the voltages $V_3$ and $V_4$ will be substantially equal to 1.8V and 1.6V, respectively. A comparator 512 compares the value of the voltage $V_R$ with that of the voltage $V_3$, and outputs a comparison signal $S_3$. A comparator 514 compares the value of the voltage $V_R$ with that of the voltage $V_4$, and outputs a comparison signal $S_4$.

Figures 8, 9:
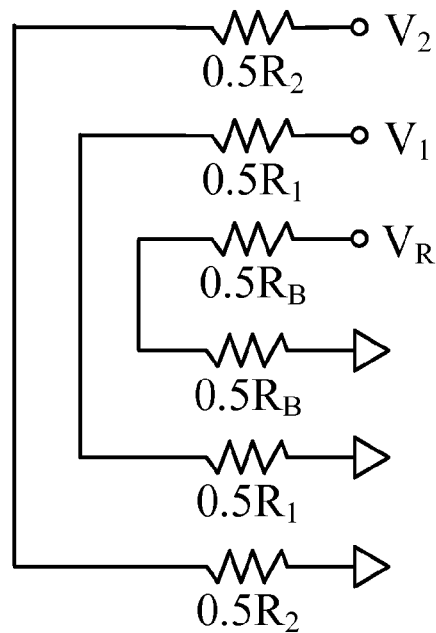
FIG. 8 is a table illustrating digital codes generated based on the reference cell current.
FIG. 9 is an illustration of a resistor layout constructed and arranged according to one embodiment of the present invention.

Referring to FIG. 7, the semiconductor memory device 70 further comprises a state machine 516 which is configured to generate a plurality of digital codes $D_X$ based on the comparison signals $S_1$, $S_2$, $S_3$, and $S_4$. FIG. 8 is a table illustrating digital codes $D_X$ generated based on the reference cell current.

Referring to FIG. 8, in condition I where the value of the voltage $V_R$ is greater than that of the voltage $V_3$, the digital code $D_X$ is set to code1. In condition II where the value of the voltage $V_R$ is in the range between the value of the voltage $V_3$ and the value of the voltage $V_1$, the digital code $D_X$ is set to code2. In condition III where the value of the voltage $V_R$ is in the range between the value of the voltage $V_2$ and the value of the voltage $V_4$, the digital code $D_X$ is set to code3. In condition IV where the value of the voltage $V_R$ is less than that of the voltage $V_4$, the digital code $D_X$ is set to code4.

After the state machine 516 generates a specific digital code, the trimming circuit 510 performs the trimming of the reference cell $M_R$ based on the code. For example, if the state machine 516 generates the digital code $D_X$ code1, the trimming circuit 510 is set to program the reference cell $M_R$ with a first selected programming strength, and if the state machine 516 generates the digital code $D_X$ code2, the trimming circuit 510 is set to program the reference cell $M_R$ with a second selected programming strength, wherein the first selected programming strength is greater than the second selected programming strength. The trimming circuit 510 may apply a program pulse to the reference cell $M_R$ with a higher positive peak voltage value or with a longer duty cycle when the greater programming strength is required. However, the present invention is not limited to this. In such method, the program time of the reference cell $M_R$ can be reduced by applying different programming strength.

On the other hand, if the state machine 516 generates the digital code $D_X$ code3, the trimming circuit 510 is set to erase the reference cell $M_R$ with a first selected erasing strength, and if the state machine 516 generates the digital code $D_X$ code4, the trimming circuit 510 is set to program the reference cell $M_R$ with a second selected erasing strength, wherein the second selected erasing strength is greater than the first selected erasing strength. The trimming circuit 510 may apply an erase pulse to the reference cell $M_R$ with a higher negative peak voltage value or with a longer duty cycle when the greater erasing strength is required. However, the present invention is not limited to this. In such method, the erase time of the reference cell $M_R$ can be reduced by applying different erasing strength.

Referring to FIG. 6, resistors $R_B$, $R_1$, and $R_2$ have the same resistance value. However, since the resistance of the resistors $R_B$, $R_1$, and $R_2$ can be affected by variations in manufacturing processes, a technique for geometrically positioning the resistors $R_B$, $R_1$, and $R_2$ around a chip of the memory device 50 is required. FIG. 9 is an illustration of a resistor layout constructed and arranged according to one embodiment of the present invention. Referring to FIG. 9, resistors $R_B$, $R_1$, and $R_2$ have similar layout patterns. Each resistor is decomposed into two halves that are laid out in parallel and connected in series, and the resistors $R_B$, $R_1$, and $R_2$ are placed nearby and placed in symmetry along the same axis. Therefore, a mismatch between the resistors $R_B$, $R_1$, and $R_2$ can be improved.

In addition, the precision resistor $R_{EXT}$ in FIG. 6 is disposed outside the semiconductor memory device 50. Therefore, a user can select the resistance of the resistor $R_{EXT}$ more easily and flexibly according to different conditions. For example, if a given error range of the reference cell current is more strictly, taken into consideration of the variations of the gain error and offset of the operational amplifiers, mismatch between the resistors and transistors, etc, the resistor $R_{EXT}$ may be selected to have a tight tolerance.

In the above embodiments, the comparators 506 and 508 are voltage-type comparators. In another embodiment of the present invention, the comparators 506 and 508 are current-type comparators, and the comparator 506 compares the current $I_R$ with the current $I_1$ while the comparator 508 compares the current $I_R$ with the current $I_2$. If the current $I_R$ is greater than the current $I_1$, the comparator 506 outputs a comparison signal $S_1$ at a logic high level. When receiving the comparison signal $S_1$ at the logic high level, the trimming circuit 510 repeats the programming and the verification of the reference cell $M_R$ until the values of the current $I_R$ is less than that of the current $I_1$. If the current $I_R$ is less than the current $I_2$, the comparator 508 outputs the comparison signal $S_2$ at a logic low level. When receiving the comparison signal $S_2$ at the logic low level, the trimming circuit 510 repeats the erasing and the verification of the reference cell $M_R$ until the values of the current $I_R$ is greater than that of the current $I_1$.

There are a variety of methods to verify whether the threshold voltage of the reference cell $M_R$ is trimmed to its desired value or not. FIG. 10 is a table illustrating different methods to verify the state of the reference cell $M_R$ according to one embodiment of the present invention. Referring to FIG. 10, in the case of the method I, in order to confirm whether the reference cell $M_R$ is trimmed to an erase state, a tester (not shown) may supply the bias voltage $V_B$ whose value above the threshold voltage value of an erased reference cell to a gate of the reference cell $M_R$, and supply the control voltage $V_C$ whose value below the threshold voltage value of the erased reference cell to the voltage-to-current circuit 504 as shown in FIG. 6. For example, the threshold voltage value of the erased reference cell in this embodiment is about 3V. Therefore, the voltages $V_B$ and $V_C$ can be set to 5V and 1.7V, respectively. In this case, if the reference cell current is not within the target range (e.g. 170 μA±5 μA), the trimming circuit 510 repeats trimming and verification steps on the reference cell $M_R$ until the reference cell current is within the target range.

In order to confirm whether the reference cell $M_R$ is trimmed to a read state, the tester may supply the bias voltage $V_B$ whose value above the threshold voltage value of a read reference cell to the gate of the reference cell $M_R$, and supply the control voltage $V_C$ whose value below the threshold voltage value of the read reference cell to the voltage-to-current circuit 504. In order to confirm whether the reference cell $M_R$ is trimmed to a program state, the tester may supply the bias voltage $V_B$ whose value above the threshold voltage value of a programmed reference cell to the gate of the reference cell $M_R$, and supply the control voltage $V_C$ whose value below the threshold voltage value of the programmed reference cell to the voltage-to-current circuit 504.

Referring to FIG. 10, in the case of the method II, in order to confirm whether the reference cell $M_R$ is trimmed to an erase state, the tester may supply the bias voltage $V_B$ whose value substantially equal to the threshold voltage value of an erased reference cell to the gate of the reference cell $M_R$, and supply the control voltage $V_B$ resulting in a small current flowing through the precision resistor $R_{EXT}$ to the voltage-to-current circuit 504 as shown in FIG. 6. For example, the resistance of the resistor $R_{EXT}$ can be selected as 100KΩ, and the voltages $V_B$ and $V_C$ can be set to 3V and 0.8V, respectively. Therefore, a small current flowing through the resistor $R_{EXT}$ is about 8 μA. In this case, if the reference cell current is not within the target range (e.g. 8 μA±0.5 μA), the trimming circuit 510 repeats trimming and verification steps on the reference cell $M_R$ until the reference cell current is within the target range.

In order to confirm whether the reference cell $M_R$ is trimmed to a read state, the tester may supply the bias voltage $V_B$ whose value substantially equal to the threshold voltage value of an read reference cell to the gate of the reference cell $M_R$, and supply the control voltage $V_C$ resulting in a small current flowing through the precision resistor $R_{EXT}$ to the voltage-to-current circuit 504. In order to confirm whether the reference cell $M_R$ is trimmed to a program state, the tester may supply the bias voltage $V_B$ whose value substantially equal to the threshold voltage value of an programmed reference cell to the gate of the reference cell $M_R$, and supply the control voltage $V_C$ resulting in a small current flowing through the precision resistor $R_{EXT}$ to the voltage-to-current circuit 504 as shown in FIG. 6.

Referring to FIG. 10, in the case of the method III, in order to confirm whether the reference cell $M_R$ is trimmed to a read state, the tester may supply the bias voltage $V_B$ having a first value to the gate of the reference cell $M_R$, and the control voltage $V_C$ having a second value to the voltage-to-current circuit 504, wherein the first value is above the threshold voltage value of a read reference cell and the second value is below the threshold voltage value of the read reference cell. For example, the first value and the second value can be set to 5V and 1.1V, respectively, in this embodiment.

In order to confirm whether the reference cell $M_R$ is trimmed to an erase state, the tester may supply the bias voltage $V_B$ having a third value is applied to the gate of the reference cell $M_R$, and the control voltage $V_C$ having the second value is applied to the voltage-to-current circuit 504, wherein the third value is obtained by subtracting the difference between the threshold voltage value of the read reference cell and the threshold voltage value of an erased reference cell from the first value. For example, since the first value is set to 5V and the threshold voltage values of the read reference cell and the erased reference cell are set to 3.75V and 3V, respectively, in this embodiment, the third value can be set to 4.25V.

In order to confirm whether the reference cell $M_R$ is trimmed to a program state, the tester may supply the bias voltage $V_B$ having a fourth value to the gate of the reference cell, and the control voltage value having the second value to the second voltage-to-current circuit, wherein the fourth value is obtained by adding the difference between the threshold voltage value of a programmed reference cell and the threshold voltage value of the read reference cell to the first value. For example, since the first value is set to 5V and the threshold voltage values of the programmed reference cell and the read reference cell are set to 6V and 3.75V, respectively, in this embodiment, the fourth value can be set to 7.25V.

Figure 11:
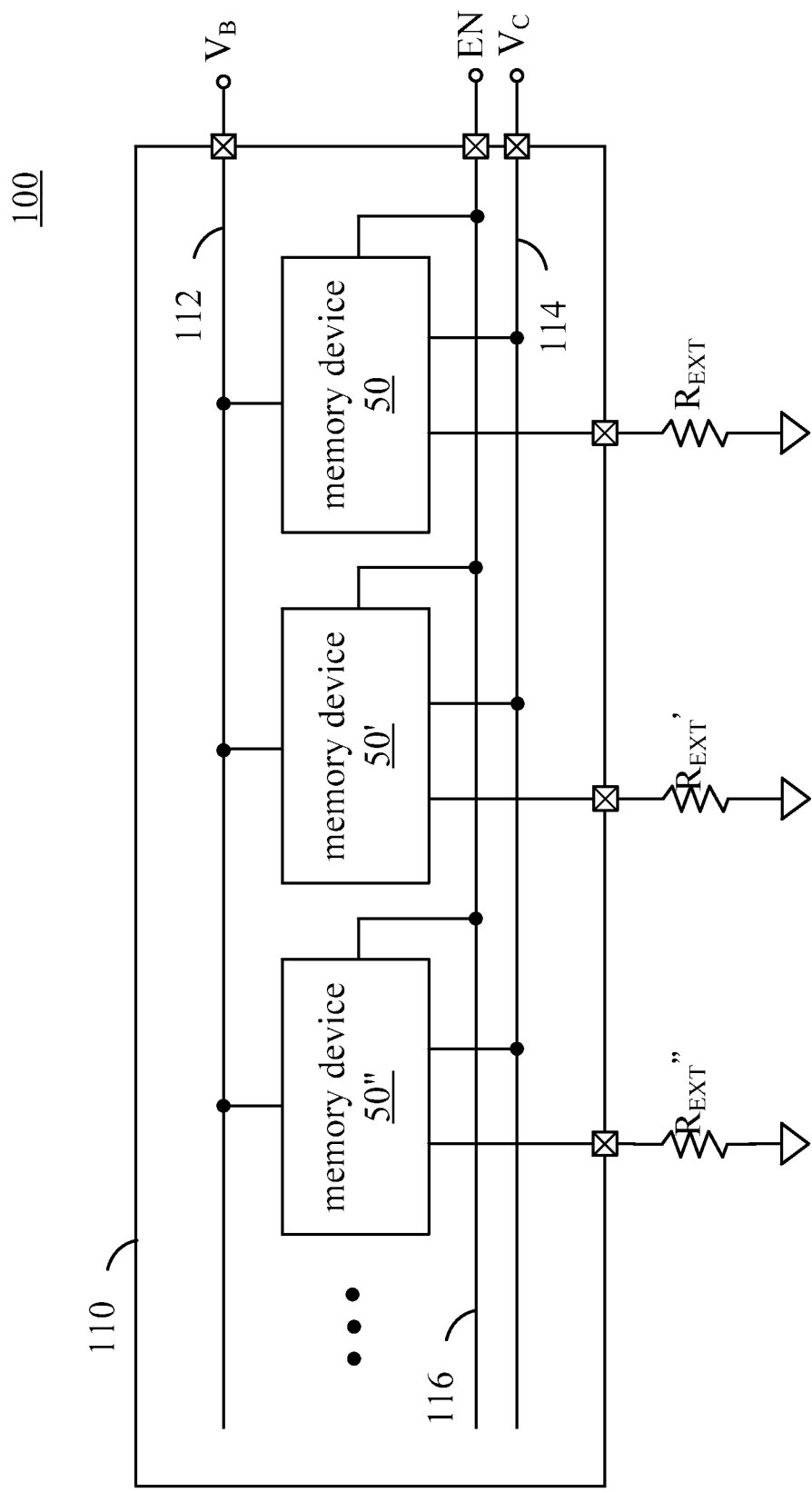
FIG. 11 shows a block diagram of a parallel trimming apparatus according to one embodiment of the present invention.

In addition, the present invention also discloses a parallel trimming apparatus for trimming a plurality of memory cells in a plurality of memory devices. For a large number of memory devices, parallel trimming allows different cells to be trimmed at the same time. For example, instead of having to trim each cell individually, parallel trimming features incorporated into the memory device can allow a manufacturer to test four, eight, sixteen, etc. cells at a time, thus reducing the overall trimming time for the device. FIG. 11 shows a block diagram of a parallel trimming apparatus 100 according to one embodiment of the present invention. Referring to FIG. 11, the parallel trimming apparatus 100 includes a test board 110, a first bus 112, a second bus 114, a third bus 116, and a plurality of precision resistors $R_{EXT}$, $R_{EXT}'$, and $R_{EXT}''$, and a plurality of semiconductor memory devices 50, 50', and 50''.

The semiconductor memory devices 50, 50', and 50'' are mounted on the test board 110 and are connected to the first bus 112 and the second bus 114 in a parallel manner on the test board 110 in FIG. 11. The semiconductor memory devices 50, 50', and 50'' are also connected to the third bus 116 for receiving an enable signal EN. In addition, the semiconductor memory devices 50, 50', and 50'' are connected to the resistors $R_{EXT}$, $R_{EXT}'$, and $R_{EXT}''$, respectively.

The semiconductor memory devices 50, 50', and 50'' have approximately the same structures as those shown in FIGS. 5-7. In operation, when receiving the test enable signal EN, the memory devices 50, 50', and 50'' are simultaneously enabled, and thus the memory cells in different memory devices can be trimmed at the same time. After receiving the test enable signal EN, a tester (not shown) applies a bias voltage $V_B$ to the first bus 112, and a plurality of reference cell currents in different memory devices are generated. The tester also applies a control voltage $V_C$ to the second bus 114, and a plurality of first currents $I_1$ and second current $I_2$ in different memory devices are generated. After comparing the current $I_1$ with the reference cell current and comparing the second current $I_2$ with the reference cell current in each memory device, the reference cell in a corresponding memory device can be trimmed based on the comparison results. Since the operation is similar to that described above with reference to FIGS. 5-10, description thereof is omitted.

The above-described embodiments of the present invention are intended to be illustrative only. Numerous alternative embodiments may be devised by those skilled in the art without departing from the scope of the following claims.

What is claimed is:

1. A semiconductor memory device comprising:
a first voltage-to-current circuit which comprises a reference cell configured to convert a bias voltage to a reference current;
a first resistor connected to the first voltage-to-current circuit for generating a reference voltage based on the reference current;
a second voltage-to-current circuit configured to convert a control voltage to a first current and a second current whose value is less than the value of the first current;
a second resistor connected to the second voltage-to-current circuit for generating a first voltage based on the value of the first current;
a third resistor connected to the second voltage-to-current circuit for generating a second voltage based on the value of the second current;
a first comparator configured to compare the reference voltage with the first voltage, and output a first comparison signal;
a second comparator configured to compare the reference voltage with the second voltage, and output a second comparison signal; and
a trimming circuit configured to trim the reference cell based on the first and second comparison signals;
wherein the resistance of the second resistor is substantially equal to that of the third resistor; and
wherein a precision resistor is disposed outside the semiconductor memory device, and the second voltage-to-current circuit generates the first current and the second current based on the value of the control voltage and the resistance of the precision resistor.

2. The semiconductor memory device of claim 1, wherein the first resistor, the second resistor, and the third resistor have similar layout patterns and are geometrically positioned in the neighborhood of the semiconductor memory device.

3. The semiconductor memory device of claim 1, wherein the trimming circuit is configured to program the reference cell if the value of the reference voltage is greater than that of the first voltage, and is configured to erase the reference cell if the value of the reference voltage is less than that of the second voltage.

4. The semiconductor memory device of claim 1, further comprising:
- a fourth resistor connected to the second voltage-to-current circuit for generating a third voltage based on the a third current;
- a fifth resistor connected to the second voltage-to-current circuit for generating a fourth voltage based on a fourth current;
- a third comparator configured to compare the reference voltage with the third voltage, and output a third comparison signal; and
- a fourth comparator configured to compare the reference voltage with the fourth voltage, and output a fourth comparison signal;
- wherein the second voltage-to-current circuit generates the third current and the fourth current, the value of the third current is greater than that of the first current, and the value of the fourth current is less than that of the second current;
- wherein the resistances of the fourth and the fifth resistors are substantially equal to that of the second resistor; and
- wherein the trimming circuit is configured to program the reference cell with a first selected programming strength if the value of the reference voltage is greater than that of the third voltage, to program the reference cell with a second selected programming strength if the value of the reference voltage is in the range between the value of the third voltage and the value of the first voltage, to erase the reference cell with a first selected erasing strength if the value of the reference voltage is less than that of the fourth voltage, and to erase the reference cell with a second selected erasing strength if the reference voltage is in the range between the value of the second voltage and the value of the fourth voltage, wherein the second selected programming strength is weaker than the first selected programming strength, and the second selected erasing strength is weaker than the first selected erasing strength.

5. The semiconductor memory device of claim 4, further comprising:
- a state machine configured to generate a plurality of digital codes based on the first, second, third, and the fourth comparison signals;
- wherein the trimming circuit is configured to trim the reference cell based on the plurality of digital codes.

6. The semiconductor memory device of claim 4, wherein the resistance of the precision resistor is selected based on a given error range of the reference current and offset voltages from the second voltage-to-current circuit.

7. The semiconductor memory device of claim 1, wherein in order to confirm whether the reference cell is trimmed to an erase state or not, the bias voltage whose value above the threshold voltage value of an erased reference cell is applied to a gate of the reference cell, and the control voltage whose value below the threshold voltage value of the erased reference cell is applied to the second voltage-to-current circuit; in order to confirm whether the reference cell is trimmed to a read state or not, the bias voltage whose value above the threshold voltage value of an read reference cell is applied to the gate of the reference cell, and the control voltage whose value below the threshold voltage value of the read reference cell is applied to the second voltage-to-current circuit; and in order to confirm whether the reference cell is trimmed to a program state or not, the bias voltage whose value above the threshold voltage value of an programmed reference cell is applied to the gate of the reference cell, and the control voltage whose value below the threshold voltage value of the programmed reference cell is applied to the second voltage-to-current circuit.

8. The semiconductor memory device of claim 1, wherein in order to confirm whether the reference cell is trimmed to an erase state or not, the bias voltage whose value substantially equal to the threshold voltage value of an erased reference cell is applied to a gate of the reference cell, and the control voltage resulting in a small current flowing through the precision resistor is applied to the second voltage-to-current circuit; in order to confirm whether the reference cell is trimmed to a read state or not, the bias voltage whose value substantially equal to the threshold voltage value of an read reference cell is applied to the gate of the reference cell, and the control voltage resulting in a small current flowing through the precision resistor is applied to the second voltage-to-current circuit; and in order to confirm whether the reference cell is trimmed to a program state or not, the bias voltage whose value substantially equal to the threshold voltage value of an programmed reference cell is applied to the gate of the reference cell, and the control voltage resulting in a small current flowing through the precision resistor is applied to the second voltage-to-current circuit.

9. The semiconductor memory device of claim 1, wherein in order to confirm whether the reference cell is trimmed to a read state or not, the bias voltage having a first value is applied to a gate of the reference cell, and the control voltage having a second value is applied to the second voltage-to-current circuit, wherein the first value is above the threshold voltage value of a read reference cell and the second value is below the threshold voltage value of the read reference cell; in order to confirm whether the reference cell is trimmed to an erase state or not, the bias voltage having a third value is applied to the gate of the reference cell, and the control voltage having the second value is applied to the second voltage-to-current circuit, wherein the third value is obtained by subtracting the difference between the threshold voltage value of the read reference cell and the threshold voltage value of an erased reference cell from the first value; and in order to confirm whether the reference cell is trimmed to a program state or not, the bias voltage having a fourth value is applied to the gate of the reference cell, and the control voltage value having the second value is applied to the second voltage-to-current circuit, wherein the fourth value is obtained by adding the difference between the threshold voltage value of a programmed reference cell and the threshold voltage value of the read reference cell to the first value.

10. A parallel trimming apparatus comprising:
- a test board;
- a first bus;
- a second bus;
- a third bus;
- a plurality of precision resistors;
- a plurality of semiconductor memory devices mounted on the test board and connected to the first bus and the second bus in a parallel manner, the plurality of semiconductor memory devices being simultaneously enabled based on an enable signal sent from the third bus, each semiconductor memory device connected to a corresponding one of the precision resistors, and each semiconductor memory device comprising:
  - a first voltage-to-current circuit which comprises a reference cell configured to convert a bias voltage to a reference current;
  - a first resistor connected to the first voltage-to-current circuit for generating a reference voltage based on the reference current;

a second voltage-to-current circuit configured to convert a control voltage to a first current and a second current based on the value of the control voltage and the resistance of the corresponding precision resistor;

a second resistor connected to the second voltage-to-current circuit for generating a first voltage based on the first current;

a third resistor connected to the second voltage-to-current circuit for generating a second voltage based on the second current;

a first comparator configured to compare the reference voltage with the first voltage, and output a first comparison signal;

a second comparator configured to compare the reference voltage with the second voltage, and output a second comparison signal; and a trimming circuit configured to trim the reference cell based on the first and second comparison signals;

wherein the resistance of the second resistor is substantially equal to that of the third resistor;

wherein the value of the second current is less than the value of the first current; and wherein the bias voltage is sent via the first bus and the control voltage is sent via the second bus.

11. The parallel trimming apparatus of claim 10, wherein the first resistor, the second resistor, and the third resistor in each semiconductor memory device have similar layout patterns and are geometrically positioned in the neighborhood of the semiconductor memory device.

12. The parallel trimming apparatus of claim 10, wherein the trimming circuit in each semiconductor memory device is configured to program the reference cell if the value of the reference voltage is greater than that of the first voltage, and is configured to erase the reference cell if the value of the reference voltage is less than that of the second voltage.

13. The parallel trimming apparatus of claim 10, wherein each semiconductor memory device further comprises:

a fourth resistor connected to the second voltage-to-current circuit for generating a third voltage based on the a third current;

a fifth resistor connected to the second voltage-to-current circuit for generating a fourth voltage based on a fourth current;

a third comparator configured to compare the reference voltage with the third voltage, and output a third comparison signal; and a fourth comparator configured to compare the reference voltage with the fourth voltage, and output a fourth comparison signal;

wherein the second voltage-to-current circuit in each semiconductor memory device generates the third current and the fourth current, the value of the third current is greater than that of the first current, and the value of the fourth current is less than that of the second current;

wherein the resistances of the fourth and the fifth resistors are substantially equal to that of the second resistor; and wherein the trimming circuit in each semiconductor memory device is configured to program the reference cell with a first selected programming strength if the value of the reference voltage is greater than that of the third voltage, to program the reference cell with a second selected programming strength if the value of the reference voltage is in the range between the value of the third voltage and the value of the first voltage, to erase the reference cell with a first selected erasing strength if the value of the reference voltage is less than that of the fourth voltage, and to erase the reference cell with a second selected erasing strength if the reference voltage is in the range between the value of the second voltage and the value of the fourth voltage, wherein the second selected programming strength is weaker than the first selected programming strength, and the second selected erasing strength is weaker than the first selected erasing strength.

14. The parallel trimming apparatus of claim 13, wherein each semiconductor memory device further comprises:

a state machine configured to generate a plurality of digital codes based on the first, second, third, and the fourth comparison signals;

wherein the trimming circuit in each semiconductor memory device is configured to trim the reference cell based on the plurality of digital codes.

15. The parallel trimming apparatus of claim 10, wherein in order to confirm whether the reference cell in each semiconductor memory device is trimmed to an erase state or not, the bias voltage whose value above the threshold voltage value of an erased reference cell is applied to a gate of the reference cell, and the control voltage whose value below the threshold voltage value of the erased reference cell is applied to the second voltage-to-current circuit; in order to confirm whether the reference cell is trimmed to a read state or not, the bias voltage whose value above the threshold voltage value of an read reference cell is applied to the gate of the reference cell, and the control voltage whose value below the threshold voltage value of the read reference cell is applied to the second voltage-to-current circuit; and in order to confirm whether the reference cell is trimmed to a program state or not, the bias voltage whose value above the threshold voltage value of an programmed reference cell is applied to the gate of the reference cell, and the control voltage whose value below the threshold voltage value of the programmed reference cell is applied to the second voltage-to-current circuit.

16. The parallel trimming apparatus of claim 10, wherein in order to confirm whether the reference cell in each semiconductor memory device is trimmed to an erase state or not, the bias voltage whose value substantially equal to the threshold voltage value of an erased reference cell is applied to a gate of the reference cell, and the control voltage resulting in a small current flowing through the precision resistor is applied to the second voltage-to-current circuit; in order to confirm whether the reference cell is trimmed to a read state or not, the bias voltage whose value substantially equal to the threshold voltage value of an read reference cell is applied to the gate of the reference cell, and the control voltage resulting in a small current flowing through the precision resistor is applied to the second voltage-to-current circuit; and in order to confirm whether the reference cell is trimmed to a program state or not, the bias voltage whose value substantially equal to the threshold voltage value of an programmed reference cell is applied to the gate of the reference cell, and the control voltage resulting in a small current flowing through the precision resistor is applied to the second voltage-to-current circuit.

17. The parallel trimming apparatus of claim 10, wherein in order to confirm whether the reference cell in each semiconductor memory device is trimmed to a read state or not, the bias voltage having a first value is applied to a gate of the reference cell, and the control voltage having a second value is applied to the second voltage-to-current circuit, wherein the first value is above the threshold voltage value of a read reference cell and the second value is below the threshold voltage value of the read reference cell; in order to confirm whether the reference cell is trimmed to an erase state or not, the bias voltage having a third value is applied to the gate of the reference cell, and the control voltage having the second value is applied to the second voltage-to-current circuit, wherein the third value is obtained by subtracting the difference between the threshold voltage value of the read reference cell and the threshold voltage value of an erased reference cell from the first value; and in order to confirm whether the reference cell is trimmed to a program state or not, the bias voltage having a fourth value is applied to the gate of the reference cell, and the control voltage value having the second value is applied to the second voltage-to-current circuit, wherein the fourth value is obtained by adding the difference between the threshold voltage value of a programmed reference cell and the threshold voltage value of the read reference cell to the first value.

18. The parallel trimming apparatus of claim 10, wherein the resistance of each precision resistor is selected based on a given error range of the reference current and offset voltages from the second voltage-to-current circuit and the second resistor.

* * * * *

UNITED STATES PATENT AND TRADEMARK OFFICE
CERTIFICATE OF CORRECTION

PATENT NO. : 8,693,266 B2  
APPLICATION NO. : 13/276779  
DATED : April 8, 2014  
INVENTOR(S) : Kuo Page 1 of 1

It is certified that error appears in the above-identified patent and that said Letters Patent is hereby corrected as shown below:

On the title page, Column 1, under Item (73) Assignees:

Please delete
"Seoul National University Industry Foundation, Seoul, Republic of Korea"

Please add
--Elite Semiconductor Memory Technology, Inc., Hsinchu, Taiwan, R.O.C.--

Signed and Sealed this
Twentieth Day of May, 2014

Michelle K. Lee
*Deputy Director of the United States Patent and Trademark Office*